United States Patent

Tomishima

[11] Patent Number: 5,805,519
[45] Date of Patent: Sep. 8, 1998

[54] SEMICONDUCTOR MEMORY DEVICE

[75] Inventor: Shigeki Tomishima, Hyogo, Japan

[73] Assignee: Mitsubishi Denki Kabushiki Kaisha, Tokyo, Japan

[21] Appl. No.: 701,207

[22] Filed: Aug. 21, 1996

Related U.S. Application Data

[63] Continuation of Ser. No. 554,505, Nov. 7, 1995, abandoned.

[30] Foreign Application Priority Data

Jan. 10, 1995 [JP] Japan .................................. 7-002208

[51] Int. Cl.$^6$ ...................................................... G11C 7/00
[52] U.S. Cl. ............... 365/226; 365/189.07; 365/189.09; 365/189.11; 327/536
[58] Field of Search ............................. 365/226, 189.07, 365/189.09, 189.11, 230.06; 327/535, 536

[56] References Cited

U.S. PATENT DOCUMENTS 5,258,950  11/1993  Murashima et al. ................ 365/226 X
5,295,112   3/1994  Taniguchi ............................ 365/227
5,327,388   7/1994  Kobayashi ........................... 365/226

FOREIGN PATENT DOCUMENTS 4-70718  11/1992  Japan .

Primary Examiner—Son T. Dinh
Attorney, Agent, or Firm—Lowe, Price, LeBlanc & Becker

[57] ABSTRACT

A semiconductor memory device includes a memory cell array and a low potential setting circuit. An n channel transistor of one example of the low potential setting circuit receives a signal φ from an operation signal control circuit at its gate before operation of an internal circuit to be turned on, thereby decreasing the potential of a BSG line to a level which is close to ground potential. As a result, the increase in the potential level of the BSG line based on inflow of positive electric charge caused by operation of the internal circuit can be prevented, and the potential differences between the source and the drain and between the source and the gate of the n channel transistor can be increased. As a result, the operation speed of the internal circuit can be increased. More specifically, the access time of the semiconductor memory device is shortened.

26 Claims, 11 Drawing Sheets

SEMICONDUCTOR MEMORY DEVICE

This application is a continuation of application Ser. No. 08/544,505 filed Nov. 7, 1995 now abandoned.

BACKGROUND OF THE INVENTION

1. Field of the Invention

The present invention relates to semiconductor memory devices, and more particularly, to a semiconductor memory device adapted to increase an operation speed of an internal circuit such as a sense amplifier to shorten an access time.

2. Description of the Background Art

The driving ability of an MOS transistor changes depending on the magnitude of potential differences between the source and the drain and between the source and the gate. More specifically, when the potential differences between the source and the drain and between the source and the gate are large, the driving ability of an MOS transistor is strong, and a signal rapidly rises and falls. When the potential differences between the source and the drain and between the source and the gate are small, the driving ability of an MOS transistor is weak, and a signal slowly rises and falls. Therefore, the operation speed of an internal circuit including an MOS transistor in a semiconductor memory device changes depending on the potential differences between the source and the drain and between the source and the gate of the MOS transistor.

This will be described taking an n channel sense amplifier as an example of the internal circuit of the semiconductor memory device.

FIG. 18 is a circuit diagram showing the detail of a general n channel sense amplifier of the semiconductor memory device.

Referring to FIG. 18, paired bit lines BL, $\overline{BL}$ are electrically connected through n channel transistors Tr3 and Tr4 connected in series. The gate of n channel transistor Tr3 is connected to the $\overline{BL}$ line, and the gate of n channel transistor Tr4 is connected to the BL line. The intermediate point between n channel transistors Tr3 and Tr4, that is, a node N1 is connected to a GND line 81 through an n channel transistor Tr5 receiving a sense amplifier operation signal S0 from a sense drive in SN at its gate.

FIG. 19 is a timing chart for explaining operation of the n channel sense amplifier of FIG. 18.

As shown in FIG. 19, after a row address strobe signal $\overline{RAS}$ falls to a logical low or L level, a word line (not shown) is activated based on a row address which is an address signal AD, information in a memory cell is transmitted to the bit line BL, and the sense amplifier operation signal S0 attains a logical high or H level. More specifically, node N1 shown in FIG. 18 is brought to a $V_{SS}$ (0 V) level by n channel transistor Tr5.

Here, node N1 corresponds to the sources of n channel transistors Tr3 and Tr4. When the level of node N1 falls, and the potential level of the bit line pair BL, $\overline{BL}$ becomes higher than the level of node N1 by the threshold voltage of n channel transistor Tr3 or Tr4, either n channel transistor Tr3 or n channel transistor Tr4 is turned on, starting sensing operation.

Since a small potential is read out to the bit line BL as shown in FIG. 19, the potential of a node N2 becomes higher than that of node N1 by the threshold voltage, causing n channel transistor Tr4 to be turned on.

The bit line $\overline{BL}$ is brought to the $V_{SS}$ level as shown in FIG. 19.

At the time of stand-by of the semiconductor memory device, the bit line pair BL, $\overline{BL}$ is precharged to ½ $V_{CC}$ (power supply potential) as shown in FIG. 19. Therefore, the potential difference between node N1 and a node N3 when operation of the sense amplifier starts, that is, the potential difference between the source and the drain of n channel transistor Tr4 becomes ½ $V_{CC}$.

Therefore, in such an n channel sense amplifier, if the potential difference ½ $V_{CC}$ between the source and the drain of n channel transistor Tr4 and the potential difference between the source and the gate (the potential difference between node N2 and node N3) of n channel transistor Tr4 are large, the driving ability of n channel transistor Tr4 becomes strong, and operation of the n channel sense amplifier is speeded up.

However, due to the reduced voltage of the semiconductor memory device or the like, the potential difference ½ $V_{CC}$ between the source and the drain and the value of the potential difference between the source and the gate (the potential difference between nodes N2 and N3) of n channel transistor Tr4 sometimes become small, causing the operation speed of the n channel sense amplifier to decrease. Therefore, the access time of the semiconductor memory device becomes longer.

This problem occurs not only in the case where the source of n channel transistor Tr4 is connected to the GND line, but also in the case where the potential differences between the source and the drain and between the source and the gate become small.

The smaller potential differences between the source and the drain and between the source and the gate of an MOS transistor causes a weaker driving ability of the MOS transistor. This applies not only to the above described sense amplifier but also to other internal circuits including an MOS transistor in the semiconductor memory device, causing a longer access time of the semiconductor memory device.

SUMMARY OF THE INVENTION

One object of the present invention is to provide a semiconductor memory device adapted to increase an operation speed of an internal circuit such as a sense amplifier of the semiconductor memory device to shorten an access time of the semiconductor memory device.

The semiconductor memory device according to one aspect of the present invention includes a high potential supplying circuit supplying a high potential to a first line, a low potential supplying circuit supplying to a second line a low potential which is higher than ground potential, an internal circuit connected between the first line and the second line and including a first transistor element, a level lowering circuit connected to the second line in parallel with the low potential supplying circuit for bringing the level of the potential of the second line to a potential level which is still lower than the low potential, and an operation control circuit performing control so that the level lowering circuit is operated for a prescribed time around the time of start of operation of the internal circuit.

As described above, the potential of the second line connected to the internal circuit including the first transistor element is set to the low potential which is higher than the ground potential.

Further, the potential level of the second line connected to the internal circuit including the first transistor element is brought to a level which is still lower than the low potential for a prescribed time around the time of start of operation of the internal circuit including the first transistor element. More specifically, the potential level of a first electrode of the first transistor element connected to the second line is brought to a level which is still lower than the low potential, and the potential differences between the first electrode and a second electrode and between the first electrode and a control electrode are increased, so that the driving ability of the first transistor element becomes stronger, and that a signal rises and falls more rapidly. Further, a significant increase in the potential level of the second line based on inflow of positive electric charge caused by operation of the internal circuit can be prevented.

As a result, even when the level of the low potential is set higher than that of the ground potential in order to reduce subthreshold current, the operation speed of the internal circuit can be increased, and therefore, the access time of the semiconductor memory device can be shortened.

The semiconductor memory device according to the one aspect further includes as the internal circuit a potential difference amplifying circuit for amplifying a small potential difference read out to the bit line from a selected memory cell.

As described above, the potential differences between the first electrode and the second electrode and between the first electrode and the control electrode of the first transistor element constituting the potential difference amplifying circuit such as a sense amplifier are increased, so that the driving ability of the first transistor element becomes stronger, and that a signal rises and falls more rapidly.

As a result, the operation speed of the potential difference amplifying circuit such as a sense amplifier can be increased, and therefore, the access time of the semiconductor memory device can be shortened.

The semiconductor memory device according to another aspect of the present invention includes a high potential supplying circuit supplying a high potential to a first line, a low potential supplying circuit supplying a low potential to a second line, an internal circuit connected between the first line and the second line and including a transistor element, a level lowering circuit connected to the second line in parallel with the low potential supplying circuit for bringing the level of the potential of the second line to a potential level which is still lower than the low potential, and an operation control circuit performing control so that the level lowering circuit is operated for a prescribed time around the time of start of operation of the internal circuit.

As described above, the level of the second line connected to the internal circuit including the transistor element is brought to a level which is still lower than the low potential for a prescribed time around the time of start of operation of the internal circuit including the transistor element. More specifically, the potential level of a first electrode of the transistor element connected to the second line is brought to a level which is still lower than the low potential, and the potential differences between the first electrode and a second electrode and between the first electrode and a control electrode are increased, so that the driving ability of the transistor element becomes stronger, and that a signal rises and falls more rapidly. Further, a significant increase in the potential level of the second line based on inflow of positive electric charge caused by operation of the internal circuit can be prevented.

As a result, the operation speed of the internal circuit can be increased, and therefore, the access time of the semiconductor memory device can be shortened.

The semiconductor memory device according to the another aspect further includes as the internal circuit a word line driving circuit for driving a word line.

As described above, the level of the low potential supplied from the second line to the word line driving circuit is brought to a still lower level. More specifically, the potential level of the first electrode of the transistor element connected to the second line is brought to a still lower level, and the potential differences between the first electrode and the second electrode and between the first electrode and the control electrode are increased, so that the driving ability of the transistor element becomes stronger, and that a signal rises and falls more rapidly.

As a result, the operation speed of the word line driving circuit can be increased, and therefore, the access time of the semiconductor memory devices can be shortened.

The semiconductor memory device according to the another aspect further includes as the level lowering circuit a switching circuit connecting the second line to a line of a potential which is still lower than the low potential in response to the operation signal.

As described above, to the word line driving circuit to which the ground potential (low potential) was supplied from the second line, a negative potential (potential which is still lower than the low potential) is supplied by the switching circuit. More specifically, the potential level of the first electrode of the transistor element connected to the second line is brought not to the ground potential but to the negative potential, and the potential differences between the first electrode and the second electrode and between the first electrode and the control electrode are increased, so that the driving ability of the transistor element becomes stronger, and that a signal rises and falls more rapidly.

As a result, the operation speed of the word line driving circuit can be increased easily, and therefore, the access time of the semiconductor memory device can be shortened.

The semiconductor memory device according to still another aspect of the present invention includes a high potential supplying circuit supplying a high potential to a first line, a low potential supplying circuit supplying to a second line a low potential which is higher than ground potential, an internal circuit connected between the first line and the second line and including a first transistor element, a level lowering circuit connected to the second line in parallel with the low potential supplying circuit for lowering the level of the potential of the second line to a potential level which is still lower than the low potential, and an operation control circuit performing control so that the level lowering circuit is operated for a prescribed time before operating the internal circuit.

As described above, the potential of the second line connected to the internal circuit including the first transistor element is set at the low potential which is higher than the ground potential.

Further, the level of the second line of the internal circuit including the first transistor element is brought to a level which is still lower than the low potential for a prescribed time before operating the internal circuit including the first transistor element. More specifically, before operation of the internal circuit including the first transistor, the potential level of a first electrode of the first transistor element connected to the second line is brought to a level which is still lower than the low potential, and the potential differences between the first electrode and a second electrode and between the first electrode and a control electrode are increased, so that the driving ability of the first transistor element becomes stronger, and that a signal rises and falls more rapidly. Further, a significant increase in the potential level of the second line based on inflow of positive electric charge caused by operation of the internal circuit can be prevented.

As a result, even when the level of the low potential is set higher than the ground potential in order to reduce sub-threshold current, the operation speed of the internal circuit can be increased reliably, and therefore, the access time of the semiconductor memory device can be shortened.

The semiconductor memory device according to the still another aspect further includes as the internal circuit a potential difference amplifying circuit for amplifying a small potential difference read out to a bit line from a selected memory cell.

As described above, the potential differences between the first electrode and the second electrode and between the first electrode and the control electrode of the first transistor element constituting the potential difference amplifying circuit such as a sense amplifier are increased, so that the driving ability of the first transistor element becomes stronger, and that a signal rises and falls more rapidly.

As a result, the operation speed of the potential difference amplifying circuit such as a sense amplifier can be increased reliably, and therefore, the access time of the semiconductor memory device can be shortened.

The semiconductor memory device according to the still another aspect of the present invention further includes an operation control circuit including a circuit delaying a basic signal based on a row address strobe signal to generate an internal signal, a delay control circuit controlling the amount of delay of the internal circuit operation signal operating the potential difference amplifying circuit before operation of the potential difference amplifying circuit, and a comparison control circuit controlling the level lowering circuit according to a comparison result between a delay signal generated by the delay control circuit and the internal signal generated earlier than the internal circuit operation signal.

As described above, the time at which the level lowering circuit is turned off is controlled by the amount of delay of the internal circuit operation signal operating the potential difference amplifying circuit, and the time at which the level lowering circuit is turned on is controlled by the amount of delay of the basic signal based on the row address strobe signal.

As a result, operation of the level lowering circuit can be controlled easily.

The semiconductor memory device according to a further aspect of the present invention includes a high potential supplying circuit supplying a high potential to a first line, a low potential supplying circuit supplying a low potential to a second line, an internal circuit connected between the first line and the second line and including a transistor element, a level lowering circuit connected to the second line in parallel with the low potential supplying circuit for lowering the level of the potential of the second line to a potential level which is still lower than the low potential, and an operation control circuit performing control so that the level lowering circuit is operated for a prescribed time before operating the internal circuit.

As described above, before operating the internal circuit including the transistor element, the level of the second line connected to the internal circuit including the first transistor element is brought to a level which is still lower than the low potential for a prescribed time. More specifically, before operation of the internal circuit including the transistor element, the potential level of a first electrode of the transistor element connected to the second line is brought to a level which is still lower than the low potential, and the potential differences between the first electrode and a second electrode and between the first electrode and a control electrode are increased, so that the driving ability of the transistor element becomes stronger, and that a signal rises and falls more rapidly. Further, a significant increase in the potential level of the second line based on inflow of positive electric charge caused by operation of the internal circuit can be prevented.

As a result, the operation speed of the internal circuit can be increased reliably, and therefore, the access time of the semiconductor memory device can be shortened.

The semiconductor memory device according to the further aspect includes as the internal circuit a word line driving circuit for driving a word line.

As described above, the level of the low potential supplied to the word line driving circuit from the second line is brought to a still lower level. More specifically, the potential level of the first electrode of the transistor element connected to the second line is brought to a still lower level, and the potential differences between the first electrode and the second electrode and between the first electrode and the control electrode are increased, so that the driving ability of the transistor element becomes stronger, and that a signal rises and falls more rapidly.

As a result, the operation speed of the word line driving circuit can be increased, and therefore, the access time of the semiconductor memory device can be shortened.

The semiconductor memory device according to the further aspect includes as the level lowering circuit a switching circuit connecting the second line to a line of a potential which is still lower than the low potential in response to the operation signal.

As described above, to the word line driving circuit which was supplied with the ground potential (low potential) from the second line, a negative potential (potential which is still lower than the low potential) is supplied by the switching circuit. More specifically, the potential level of the first electrode of the transistor element connected to the second line is brought not to the ground potential but to the negative potential, and the potential differences between the first electrode and the second electrode and between the first electrode and the control electrode are increased, so that the driving ability of the transistor element becomes stronger, and that a signal rises and falls more rapidly.

As a result, the operation speed of the word line driving circuit can be increased easily, and therefore, the access time of the semiconductor memory device can be shortened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the semiconductor memory device according to the present invention will be described hereinafter with reference to the drawings.

[First Embodiment]

Figure 1:
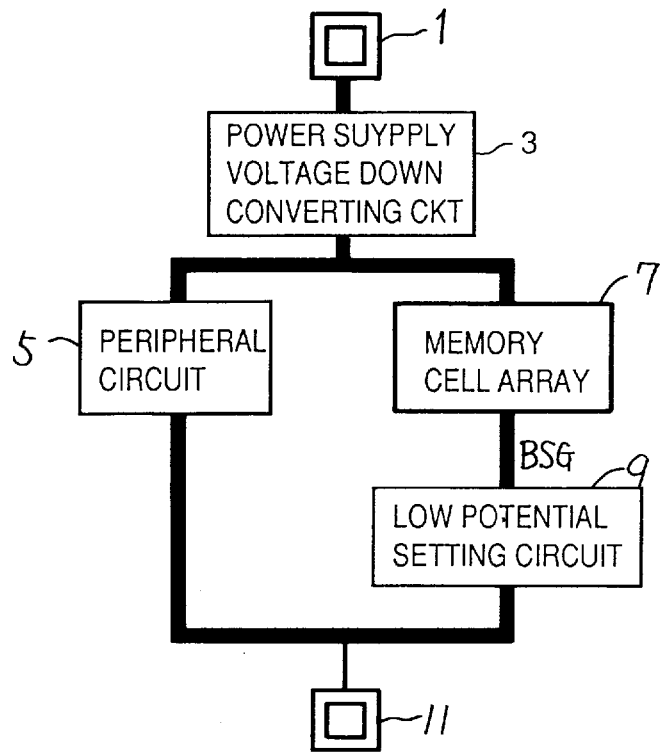
FIG. 1 is a schematic block diagram showing the whole structure of a semiconductor memory device according to a first embodiment of the present invention.

FIG. 1 is a schematic block diagram showing the whole structure of the semiconductor memory device according to the first embodiment.

Referring to FIG. 1, the semiconductor memory device includes an external power supply pad 1, a power supply voltage down converting circuit 3, a peripheral circuit 5, a memory cell array 7, a low potential setting circuit 9, and an external ground pad 11.

The semiconductor memory device down-converts external power supply voltage from external power supply pad 1 by power supply voltage down converting circuit 3, and supplies the down-converted voltage to peripheral circuit 5 and memory cell array 7 as internal power supply voltage. In order to suppress subthreshold current of a memory cell, not shown, the semiconductor memory device generates by low potential setting circuit 9 a potential (BSG) which is higher than ground potential supplied by external ground pad 11, and supplies the potential to memory cell array 7.

Figure 2:
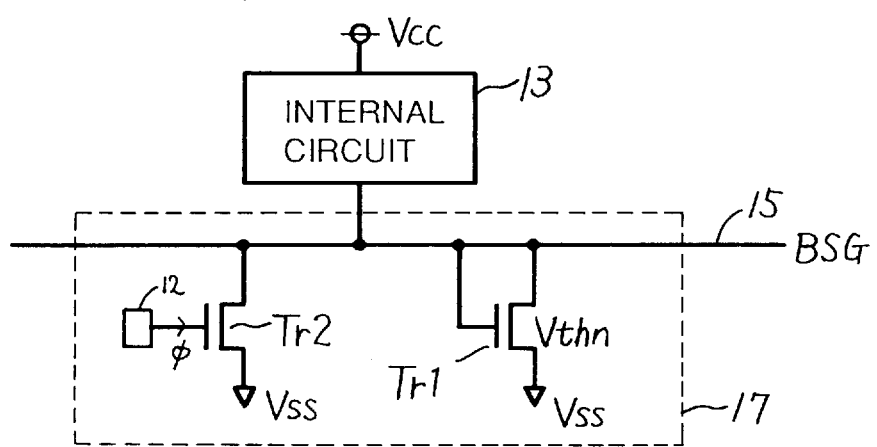
FIG. 2 is a circuit diagram showing in detail a low potential setting circuit connected to an internal circuit of the semiconductor memory device according to the first embodiment of the present invention.

FIG. 2 is a circuit diagram showing in detail an example of low potential setting circuit 9 connected to an internal circuit of memory cell array 7 of FIG. 1.

In FIG. 2, an internal circuit 13 includes an MOS transistor. Internal circuit 13 is a circuit which is related to determination of the potential of memory cell array 7 shown in FIG. 1, such as a circuit (sense amplifier circuit) for charging/discharging a bit line, not shown, and a half power supply voltage circuit, and does not include all the circuits of the semiconductor memory device (internal circuit 13 does not include a word line driving circuit in particular). A low potential setting circuit 17 includes n channel transistors Tr1 and Tr2 and an operation signal control circuit 12, which is an example of low potential setting circuit 9 shown in FIG. 9.

Internal circuit 13 is connected to a BSG line 15 having a potential (BSG) level which is higher than ground potential. The gate and the drain of n channel transistor Tr1 are connected to BSG line 15, and the drain of n channel transistor Tr2 is also connected to BSG line 15. The sources of n channel transistors Tr1 and Tr2 are connected to a ground potential $V_{SS}$ line. The gate of n channel transistor Tr2 is connected to operation signal control circuit 12.

The n channel transistor Tr1 increases the potential of BSG line 15 from the ground potential by the threshold voltage $V_{thn}$.

Current consumed for operation of internal circuit 13 such as a sense amplifier, not shown, flows in BSG line 15, causing the potential level of BSG line 15 to increase. In order to prevent this increase, the signal φ is applied to the gate of n channel transistor Tr2 simultaneously with operation of internal circuit 13 such as a sense amplifier, to discharge the current flowing in BSG line 15 by n channel transistor Tr2.

Operation of low potential setting circuit 17 of FIG. 2 will now be described in detail taking an n channel sense amplifier as an example of internal circuit 13.

Figure 3:
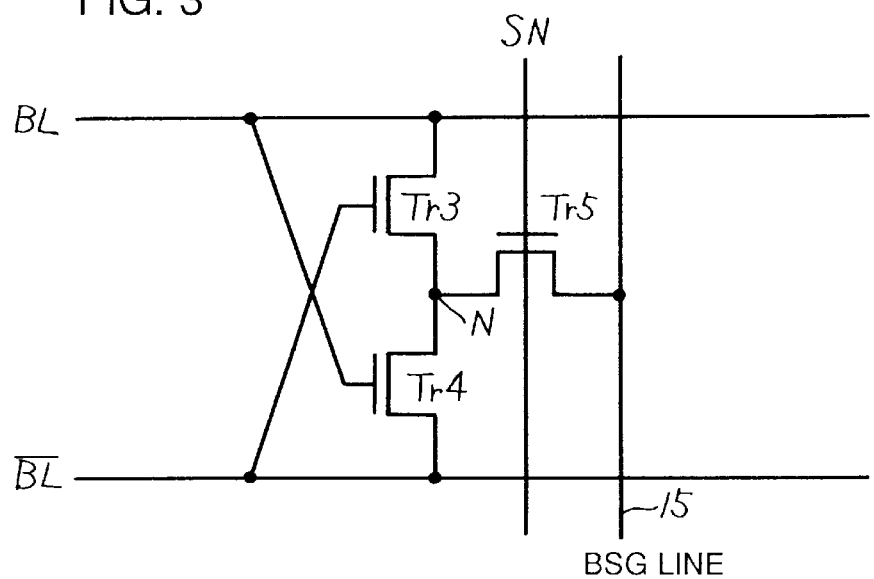
FIG. 3 is a circuit diagram showing in detail a general n channel sense amplifier connected to a BSG line of the semiconductor memory device.

FIG. 3 is a circuit diagram showing the n channel sense amplifier in detail.

Referring to FIG. 3, paired bit lines BL, $\overline{BL}$ are electrically connected through n channel MOS transistors Tr3 and Tr4 connected in series. The gate of n channel transistor Tr3 is connected to the $\overline{BL}$ line, and the gate of n channel transistor Tr4 is connected to the BL line. The intermediate point between n channel transistors Tr3 and Tr4, that is, a node N is connected to BSG line 15 through an n channel transistor Tr5 receiving the sense amplifier operation signal S0 from sense drive in SN at its gate. Note that low potential setting circuit 17 is connected to BSG line 15.

Figure 4:
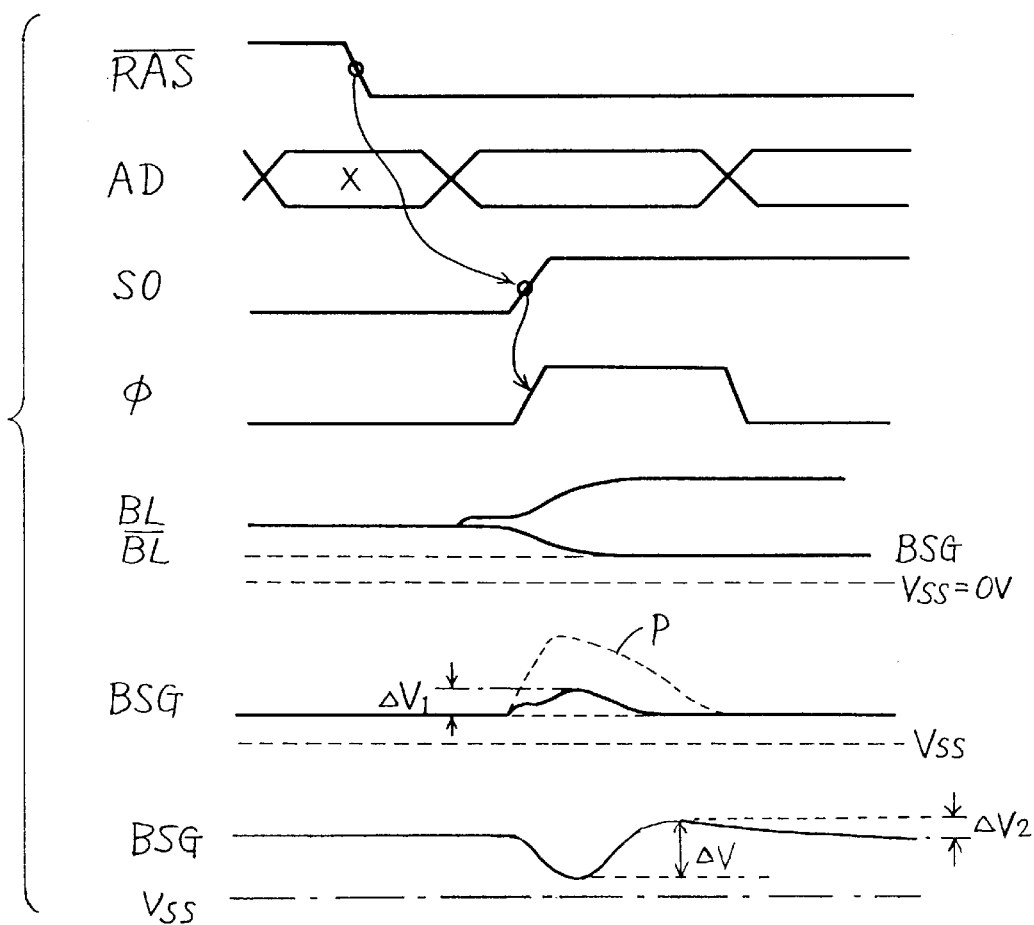
FIG. 4 is a timing chart for explaining operation of the low potential setting circuit of FIG. 2 and the n channel sense amplifier of FIG. 3.

FIG. 4 is a timing chart for explaining operation of low potential setting circuit 17 of FIG. 2 and the n channel sense amplifier of FIG. 3.

As shown in FIG. 4, at the time of stand-by when a row address strobe signal $\overline{RAS}$ is at the H level, the signal φ from operation signal control circuit 12 is at the L level. After the row address strobe signal $\overline{RAS}$ falls to the L level, a word line is activated based on a row address which is the address signal AD, information in a memory cell is transmitted to the bit line BL, and the sense amplifier operation signal S0 attains the H level. More specifically, node N shown in FIG. 3 is brought to a BSG level by n channel transistor Tr5.

Node N corresponds to the sources of n channel transistors Tr3 and Tr4. When the level of node N falls, and the level of the bit line pair is higher than that of node N by the threshold voltage of n channel transistor Tr3 or Tr4, either n channel transistor Tr3 or Tr4 is turned on, thereby starting sensing operation.

Since a small potential is read out to the bit line BL as shown in FIG. 4, n channel transistor Tr4 is turned on. The bit line $\overline{BL}$ is brought to the BSG level.

Therefore, a large current flows in BSG line 15. If n channel transistor Tr2 shown in FIG. 2 is not connected to BSG line 15, the potential of BSG line 15 increases as shown by a dotted line P of FIG. 4.

More specifically, the signal φ is pulled up by operation signal control circuit 12 in synchronization with the sense amplifier operation signal S0 as shown in FIG. 4. Accordingly, n channel transistor Tr2 is turned on, trying to pull down the potential level of BSG line 15 to the BSG level.

As a result, the increase in the potential level of BSG line 15 can be suppressed as shown by a solid line R of FIG. 4.

However, node N of the n channel sense amplifier shown in FIG. 3 is not at the ground level (Vss level) but at the BSG level. Therefore, the potential difference from a precharge level of the bit line is small, and the driving ability of n channel transistor Tr4 is weak, causing slow operation of the n channel sense amplifier. Further, although the increase in the potential level of BSG line 15 can be prevented, the increase is not completely suppressed to 0, and the level of the BSG line eventually increases by $\Delta V_1$ as shown by the solid line R of FIG. 4. As a result, node N of the n channel sense amplifier shown in FIG. 3 increases to a level which is higher than the BSG level by $\Delta V_1$, further decreasing the operation speed of the n channel sense amplifier.

Therefore, n channel transistor Tr2 tries to pull down the potential level of BSG line 15 not to the BSG level but to a potential level (level close to the ground potential $V_{SS}$) which is still lower than the BSG level as shown in FIG. 4.

As described above, in the first embodiment, node N of the n channel sense amplifier of FIG. 3 is pulled down not to the BSG level but to a still lower level which is close to the ground potential $V_{SS}$ in synchronization with the sense amplifier operation signal S0.

As a result, the potential difference between node N and the precharge level of the bit line is large, and the driving ability of n channel transistor Tr4 is strong. Therefore, the operation speed of the n channel sense amplifier is also increased.

Further, the increase (ΔV) in the potential level of BSG line 15 occurs not at the BSG level but at a low level which is close to the ground potential $V_{SS}$. Therefore, the increase ($\Delta V_2$) in the potential level seen from the BSG level is smaller than the increase ($\Delta V_1$) in the case of trying to pull down the potential level to the BSG level. More specifically, only a short time is required for the level to completely return to the BSG level, enabling high speed operation of the n channel sense amplifier.

In the above, the n channel sense amplifier connected to the BSG line was taken as an example of the internal circuit. However, also in the case where the n channel sense amplifier is connected not to the BSG line but to a GND line, by lowering the potential of the GND line down to the vicinity of a potential $V_{BB}$ level which is lower than the potential level of the GND line simultaneously with operation of the n channel sense amplifier (in synchronization with the sense amplifier operation signal S0), the operation speed of the n channel sense amplifier can be increased.

[Second Embodiment]

The entire structure of the semiconductor memory device according to the second embodiment is the same as that of the first embodiment shown in FIG. 1.

The structure of a low potential setting circuit (which corresponds to low potential setting circuit 9 of FIG. 1) of the semiconductor memory device according to the second embodiment is the same as that of low potential setting circuit 17 of the first embodiment shown in FIG. 2.

In the following description, the semiconductor memory device of FIG. 1 and low potential setting circuit 17 of FIG. 2 are regarded as the semiconductor memory device and the low potential setting circuit according to the second embodiment, respectively.

Operation of low potential setting circuit 17 will be described, taking the n channel sense amplifier of FIG. 3 as an example of internal circuit 13 of FIG. 2.

Although the signal φ is pulled up by operation signal control circuit 12 of FIG. 2 in synchronization with the sense amplifier operation signal S0 in the first embodiment, the signal φ is pulled up by operation signal control circuit 12 of FIG. 2 a prescribed time earlier than the sense amplifier operation signal S0 in the second embodiment. As a result, the potential of BSG line 15 is pulled down in advance to the vicinity of the ground potential by n channel transistor Tr2.

Figure 5:
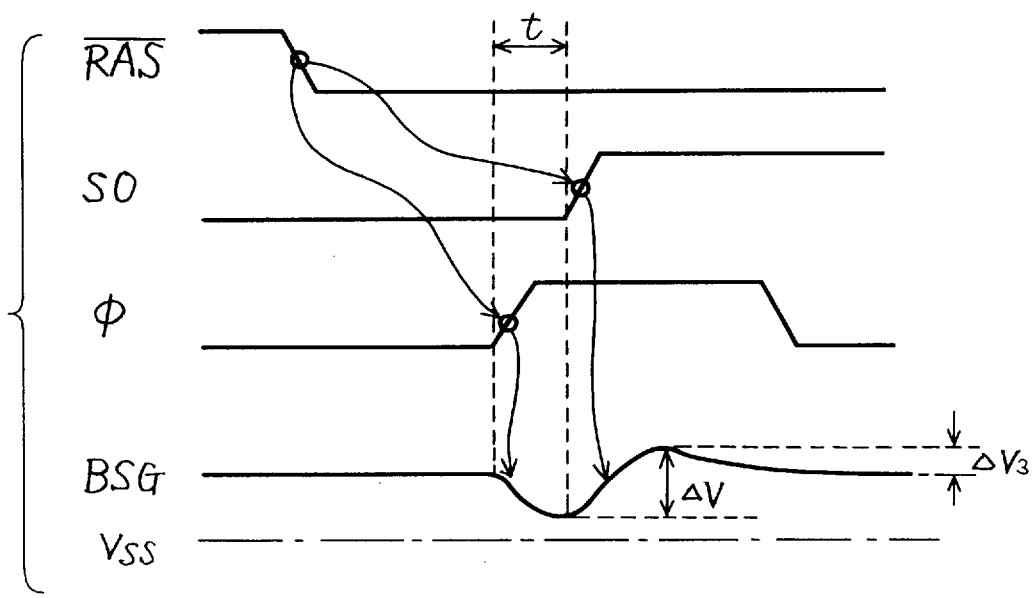
FIG. 5 is a timing chart for explaining operation of a low potential setting circuit in the case where a signal φ is pulled up before operation of an internal circuit of a semiconductor memory device according to a second embodiment of the present invention.

FIG. 5 is a timing chart for explaining operation of low potential setting circuit 17 of FIG. 2 in the case where the signal φ is pulled up earlier than the sense amplifier operation signal S0.

As shown in FIG. 5, after the row address strobe signal $\overline{RAS}$ falls to the L level, the sense amplifier operation signal S0 rises to the H level. The signal φ rises a time t earlier than the sense amplifier operation signal S0, and the potential of BSG line 15 is decreased from the BSG level to the vicinity of the ground potential $V_{SS}$. More specifically, after the potential level of BSG line 15 becomes lower than the BSG level, the n channel sense amplifier of FIG. 3 starts operating.

As described above, node N of the n channel sense amplifier of FIG. 3 is pulled down not to the BSG level, but to a still lower level which is close to the ground potential $V_{SS}$ before operation of the n channel sense amplifier. Therefore, the potential difference between node N and the precharge level of the bit line is large, and the driving ability of n channel transistor Tr4 is strong. Therefore, the operation speed of the n channel sense amplifier is more increased reliably than the case of the first embodiment.

Further, the increase (ΔV) in the potential level of BSG line 15 occurs not at the BSG level but at a low level which is close to the ground potential $V_{SS}$. Therefore, the increase ($\Delta V_3$) in the potential level seen from the BSG level is smaller than the increase ($\Delta V_1$ of FIG. 4) in the case of trying to pull down the potential level to the BSG level. More specifically, a time required for the level to completely return to the BSG level is short, enabling a high speed operation of the n channel sense amplifier.

Figure 6:
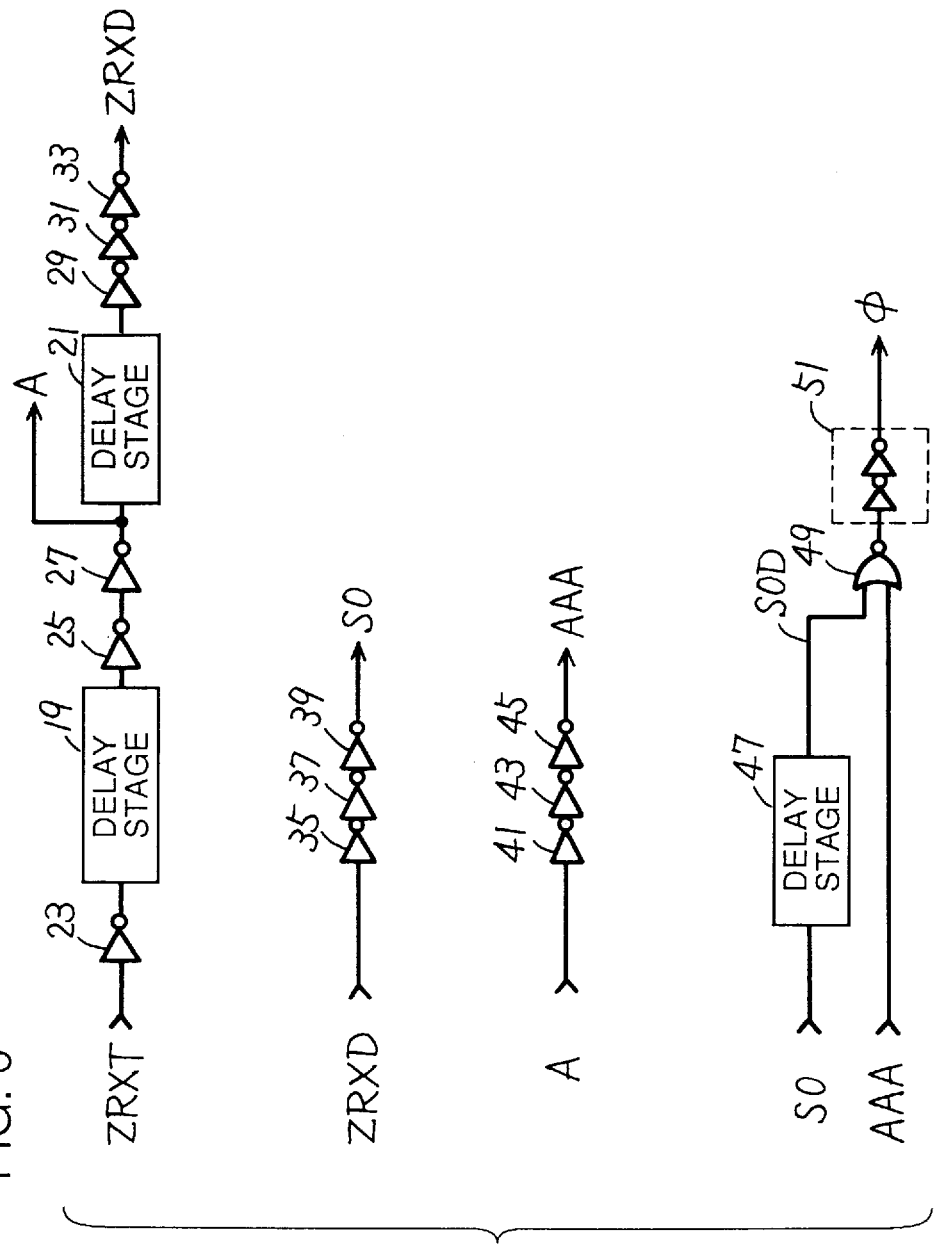
FIG. 6 is a circuit diagram showing an example of an operation signal control circuit for pulling up the signal φ before operation of the internal circuit of the semiconductor memory device according to the second embodiment of the present invention.

FIG. 6 is a circuit diagram showing an example of an operation signal control circuit for pulling up the signal φ of FIG. 2 earlier than the sense amplifier operation signal S0.

Referring to FIG. 6, the operation signal control circuit delays a basic signal ZRXT based on a row address strobe signal by a delay stage 19 formed of a plurality of inverters, not shown, to obtain a signal A. Further, the operation signal control circuit delays the basic signal ZRXT by two inverter stages 19 and 21 formed of a plurality of inverters, not shown, to obtain a delay signal ZRXD. Inverters 23, 25, 27, 29, 31 and 33 are provided for correcting the waveforms of the signal A and the delay signal ZRXD.

The delay signal ZRXD is delayed by three inverters 35, 37 and 39 to be formed into the sense amplifier operation signal S0.

The signal A is delayed by three inverters 41, 43 and 45 to be formed into a signal AAA.

A signal S0D obtained by delaying the sense amplifier operation signal S0 by a delay stage 47 is input to an NOR circuit 49 together with the signal AAA. The output of NOR circuit 49 has its waveform corrected by two inverters 51, and formed into the signal φ to be input to the gate of n channel transistor Tr2.

Figure 7:
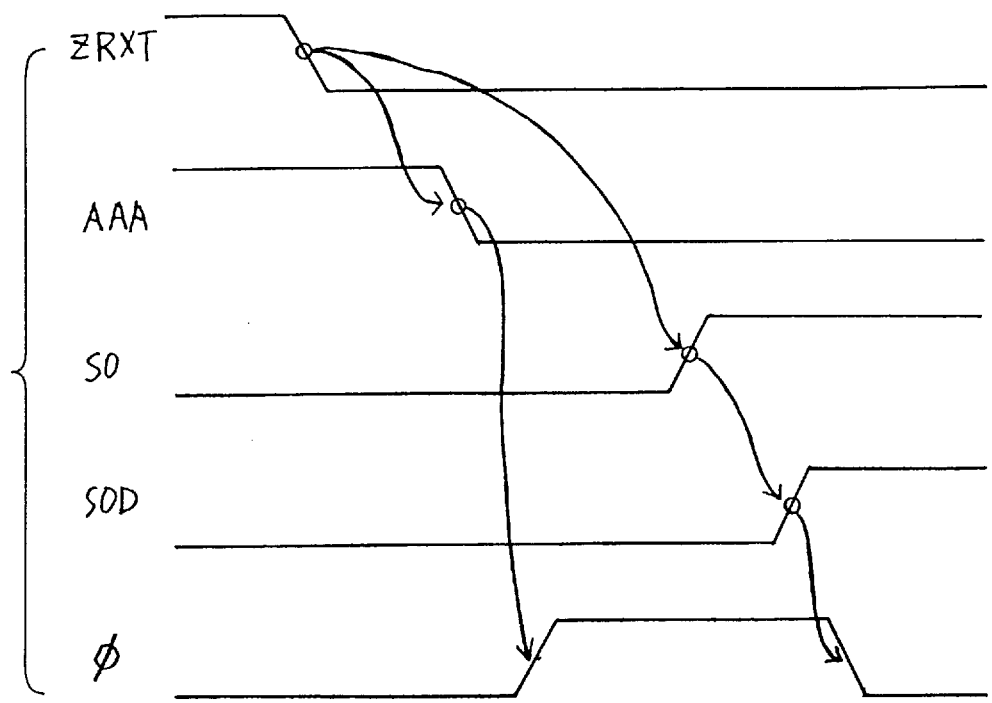
FIG. 7 is a timing chart for explaining operation of the operation signal control circuit of FIG. 6 according to the second embodiment of the present invention.

FIG. 7 is a timing chart for explaining operation of the operation signal control circuit of FIG. 6.

Referring to FIG. 7, the operation signal control circuit delays the basic signal ZRXT to form the signal AAA, the sense amplifier operation signal S0, and the signal S0D.

When the signal S0D obtained by delaying the sense amplifier operation signal S0 is at the L level, and the signal AAA is also at the L level, the signal φ is brought to the H level, as shown in FIG. 7, by NOR circuit 49 of FIG. 6. More specifically, n channel transistor Tr2 of FIG. 2 is turned on before operation of the sense amplifier, decreasing the potential of BSG line 15.

When the signal S0D obtained by delaying the sense amplifier operation signal S0 is at the H level, and the signal AAA is at the L level, the signal φ is brought to the L level, as shown in FIG. 7, by NOR circuit 49 of FIG. 6. More specifically, n channel transistor Tr2 of FIG. 2 is turned off. Note that control of the operation time of n channel transistor Tr2 is exercised by controlling the rising time of the signal S0D obtained by delaying the sense amplifier operation signal S0 by delay stage 47 of FIG. 6.

Figure 8:
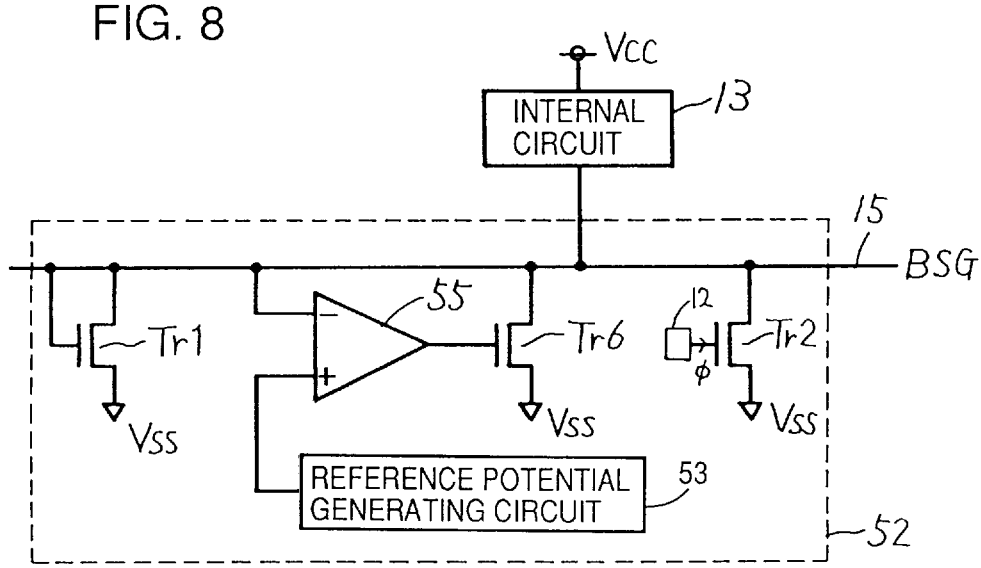
FIG. 8 is a circuit diagram showing another example of the low potential setting circuit connected to the internal circuit of the semiconductor memory device according to the second embodiment of the present invention.

FIG. 8 is a circuit diagram showing another example of low potential setting circuit 9 of FIG. 1.

Referring to FIG. 8, a low potential setting circuit 52 which is an example of low potential setting circuit 9 of FIG. 1 includes a reference potential generating circuit 53 generating a voltage at approximately the same level as that of BSG line 15, a differential amplifier 55 comparing the reference potential and the level of BSG line 15, and an n channel transistor Tr6 receiving the output of differential amplifier 55. Other than that, low potential setting circuit 52 has the same structure as low potential setting circuit 17 of FIG. 2.

The n channel transistor Tr6 has its gate connected to the output of differential amplifier 55, its drain connected to BSG line 15, and its source connected to a ground power source $V_{SS}$. If the level of BSG line 15 is higher than the reference potential output from reference potential generating circuit 53, an H level signal is applied to the gate of n channel transistor Tr6 from differential amplifier 55. In response to this, n channel transistor Tr6 is rendered conductive, discharging the potential of BSG line 15. If the potential of BSG line 15 becomes lower than the reference potential, a signal at the L level is output from differential amplifier 55, and discharge of the potential of BSG line 15 by n channel transistor Tr6 is stopped. Other than that, operation of low potential setting circuit 52 is the same as that of low potential setting circuit 17 of FIG. 2.

Figure 9:
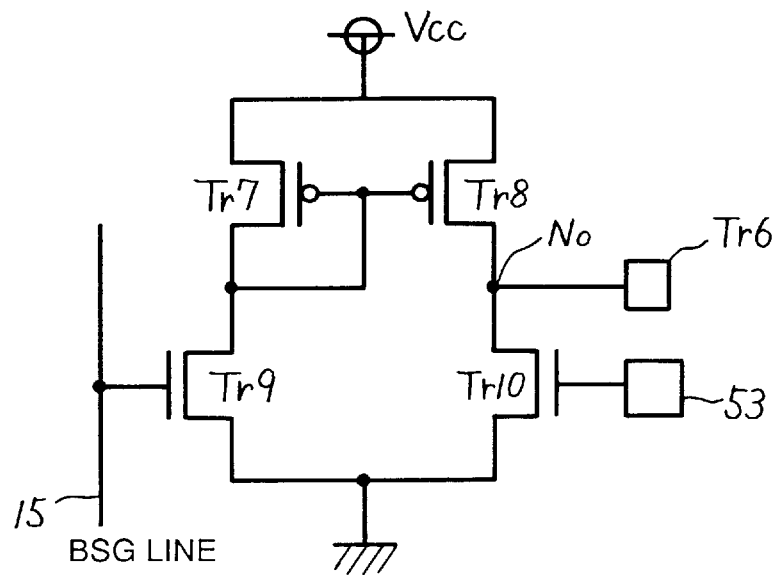
FIG. 9 is a circuit diagram showing an example of a differential amplifier according to the second embodiment of the present invention.

FIG. 9 is a circuit diagram showing an example of differential amplifier 55 of FIG. 8.

Referring to FIG. 9, the differential amplifier includes p channel transistors Tr7 and Tr8, and n channel transistors Tr9 and Tr10. The drains of p channel transistors Tr7 and Tr8 are connected to the power source $V_{CC}$. The gate and the source of p channel transistor Tr7 are connected to the drain of n channel transistor Tr9. The source of n channel transistor Tr9 is grounded, and the gate of n channel transistor Tr9 is connected to BSG line 15. The gate of p channel transistor Tr8 is connected to the drain of n channel transistor Tr9, and the source of p channel transistor Tr8 is connected to the drain of n channel transistor Tr10. The gate of n channel transistor Tr10 is connected to reference potential generating circuit 53, and the source of n channel transistor Tr10 is grounded. A node $N_0$ is connected to the gate of n channel transistor Tr6.

Figure 10:
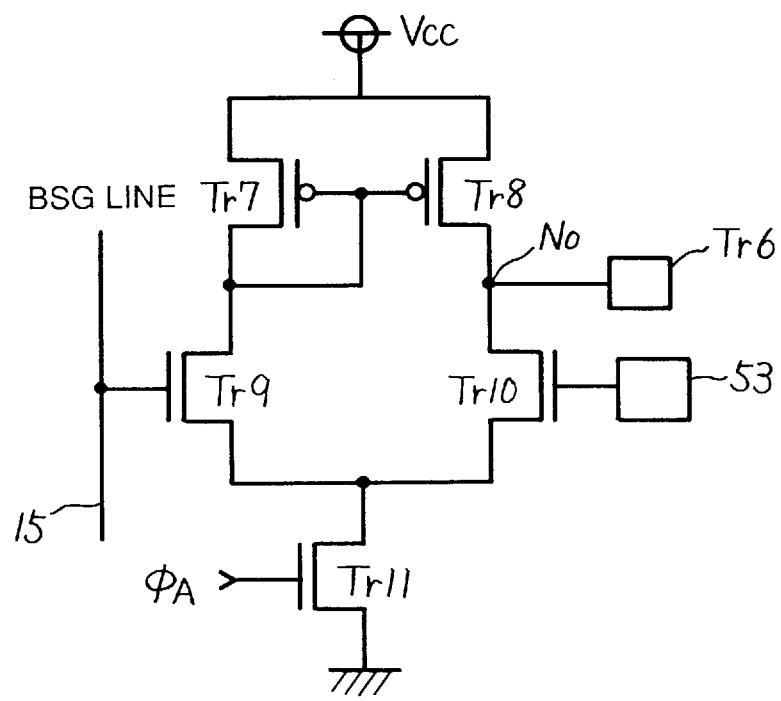
FIG. 10 is a circuit diagram showing another example of the differential amplifier according to the second embodiment of the present invention.

FIG. 10 is a circuit diagram showing another example of differential amplifier 55.

Referring to FIG. 10, the differential amplifier includes an n channel transistor Tr11 controlled by an active signal $\phi_A$ in order to cut current consumed by the differential amplifier during the stand-by period. Other than that, this differential amplifier has the same structure as that of the differential amplifier shown in FIG. 9.

Figure 11:
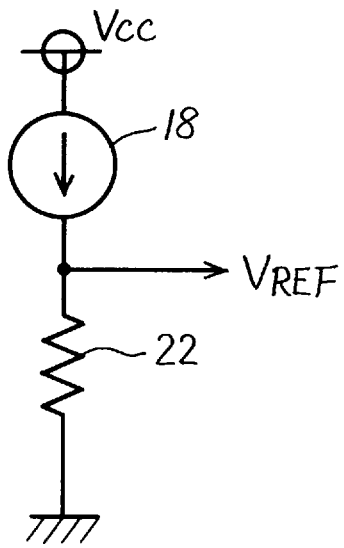
FIG. 11 is a circuit diagram showing an example of a reference potential generating circuit of FIGS. 8 to 10 according to the second embodiment of the present invention.

FIG. 11 is a circuit diagram showing an example of reference potential generating circuit 53 shown in FIGS. 8 to 10.

Referring to FIG. 11, the reference potential generating circuit includes a constant current source 18 and a resistor 22. Constant current source 18 is connected between the power source $V_{CC}$ and resistor 22. The other end of resistor 22 is grounded. By always making a constant current flow through resistor 22, a constant reference potential $V_{REF}$ is generated. Various circuits are known as constant current source 18, which will not be described here. Although various materials and elements are known as resistor 22, the description thereof will not be given here.

Figure 12:
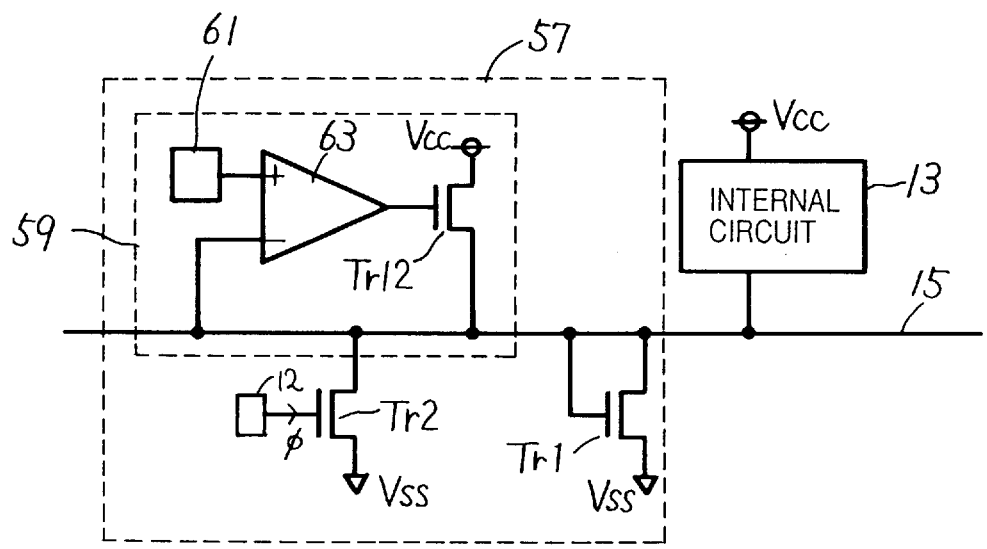
FIGS. 12 to 15 are circuit diagrams showing further examples of the low potential setting circuit connected to the internal circuit of the semiconductor memory device according to the second embodiment of the present invention.

FIG. 12 is a circuit diagram showing another example of low potential setting circuit 9 of FIG. 1.

Referring to FIG. 12, in a low potential setting circuit 57 which is an example of low potential setting circuit 9 of FIG. 1, a clamp circuit 59 is connected to BSG line 15 in order to prevent the potential of BSG line 15 from decreasing too much by operation of n channel transistor Tr2. Clamp circuit 59 includes a reference potential generating circuit 61, a differential amplifier 63 comparing the reference potential generated by reference potential generating circuit 61 and the potential of BSG line 15, and an n channel transistor Tr12 receiving the output of differential amplifier 63 at its gate and supplying a potential to BSG line 15. The gate, the drain and the source of n channel transistor Tr12 are connected to the output of differential amplifier 63, the power supply potential $V_{CC}$ and BSG line 15, respectively. Differential amplifier 63 detects that the potential level of BSG line 15 has decreased too much, and turns on n channel transistor Tr12. A differential amplifier similar to that of FIG. 9 or 10 may be used as differential amplifier 63. Other than that, the structure and operation of low potential setting circuit 57 are the same as those of low potential setting circuit 17 of FIG. 2.

Figure 13:
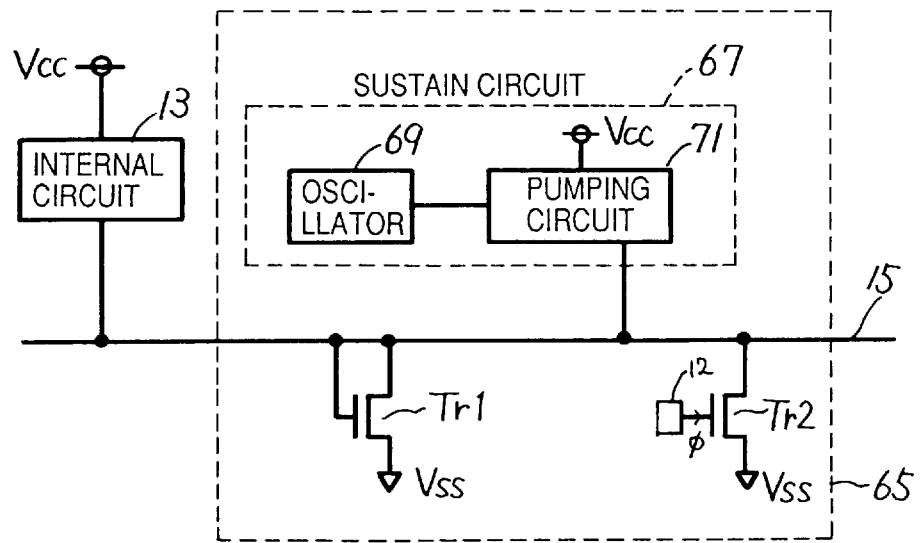

FIG. 13 is a circuit diagram showing a further example of low potential setting circuit 9 of FIG. 1.

Referring to FIG. 13, a low potential setting circuit 65 which is an example of low potential setting circuit 9 of FIG. 1 includes a sustain circuit 67 for supplementing the potential of BSG line 15 when it is decreased too much. Sustain circuit 67 is connected to BSG line 15. Sustain circuit 67 includes an oscillator 69 and a pumping circuit 71. In response to an oscillation signal oscillated by oscillator 69, pumping circuit 71 intermittently supplies the power supply voltage $V_{CC}$ to BSG line 15. Other than that, the structure and operation of low potential setting circuit 65 are the same as those of low potential setting circuit 17 of FIG. 2.

Figure 14:
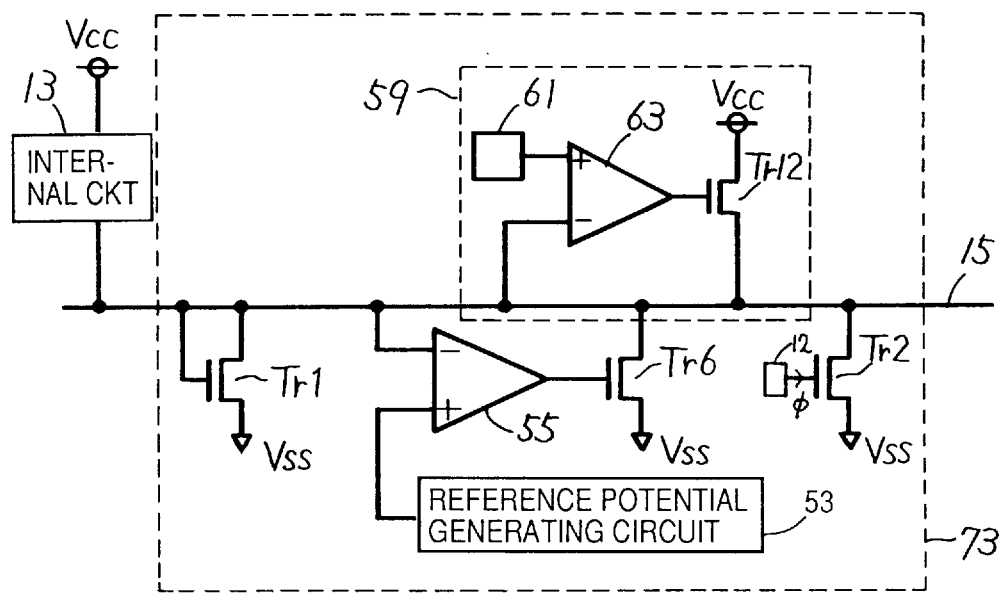

FIG. 14 is a circuit diagram showing a further example of low potential setting circuit 9 of FIG. 1.

Referring to FIG. 14, a low potential setting circuit 73 which is an example of low potential setting circuit 9 of FIG. 1 includes clamp circuit 59 of FIG. 12 in addition to the components of low potential setting circuit 52 of FIG. 8.

Operation of low potential setting circuit 73 is the same as was explained with reference to FIGS. 8 and 12.

Figure 15:
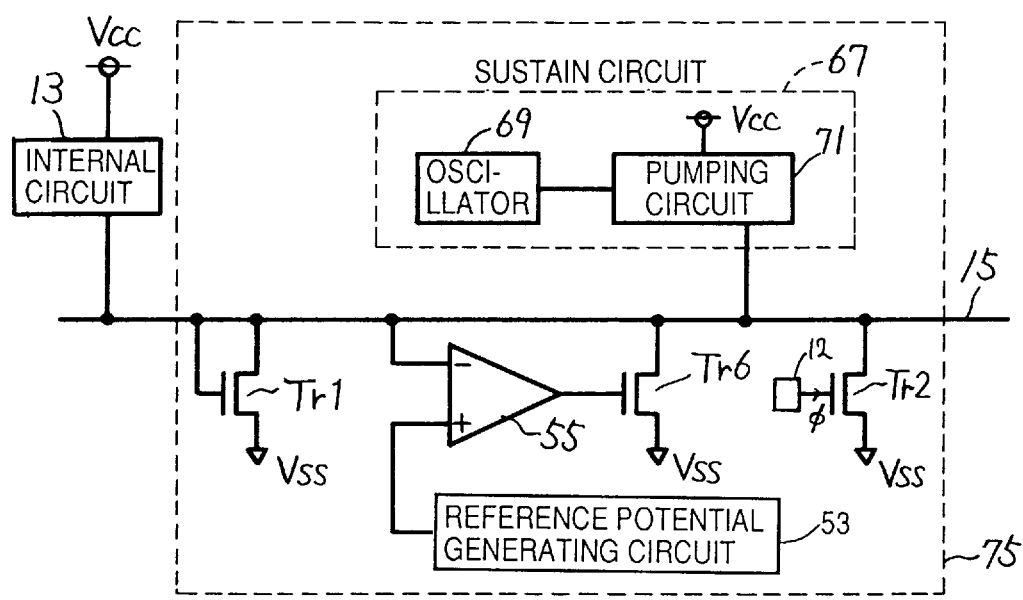

FIG. 15 is a circuit diagram showing a further example of low potential setting circuit 9 of FIG. 1.

Referring to FIG. 15, a low potential setting circuit 75 which is an example of low potential setting circuit 9 of FIG. 1 includes sustain circuit 67 of FIG. 13 instead of clamp circuit 59 of low potential setting circuit 73 of FIG. 14. Operation of low potential setting circuit 75 is the same as was explained with reference to FIGS. 14 and 13.

As described above, in the second embodiment, by applying the signal φ to the gate of n channel transistor Tr2 a prescribed time earlier than operation of internal circuit 13, n channel transistor Tr2 is turned on, thereby pulling down the potential of BSG line 15 to the vicinity of the ground potential.

As a result, when the n channel sense amplifier shown in FIG. 3 is considered as the internal circuit, the potential of node N is pulled down not to the BSG level, but to a still lower level which is close to the ground potential a prescribed time earlier than operation of the n channel sense amplifier. Therefore, the potential difference between node N and the bit lines BL, $\overline{BL}$ is large, and a higher speed operation of the n channel sense amplifier than the case of the first embodiment is ensured.

Further, although the potential level of the BSG line is increased by inflow of positive electric charge to BSG line 15 caused by operation of n channel sense amplifier, the increase becomes smaller, a time required for the level to completely return to the BSG level is short, and a high speed operation of the sense amplifier can be implemented. As a result, the access time of the semiconductor memory device is shortened.

In the above description, the n channel sense amplifier connected to the BSG line was taken as an example of the internal circuit. However, even when the n channel sense amplifier is connected not to the BSG line but to the GND line, the operation speed of the n channel sense amplifier can be increased by lowering the potential of the GND line down to the vicinity of the potential $V_{BB}$ level which is lower than the potential level of the GND line before operation of the n channel sense amplifier.

In the above embodiment, the level of the line of a low potential connected to the internal circuit is brought to a still lower potential level by the signal φ before operation of the internal circuit. However, the potential level of the line of the low potential may be brought to a still lower level in synchronization with operation of the internal circuit. In this case, the same effect as that of the first embodiment can be obtained.

[Third Embodiment]

As the background of the third embodiment of the present invention, a general word line driving circuit will first be described.

Figure 16:
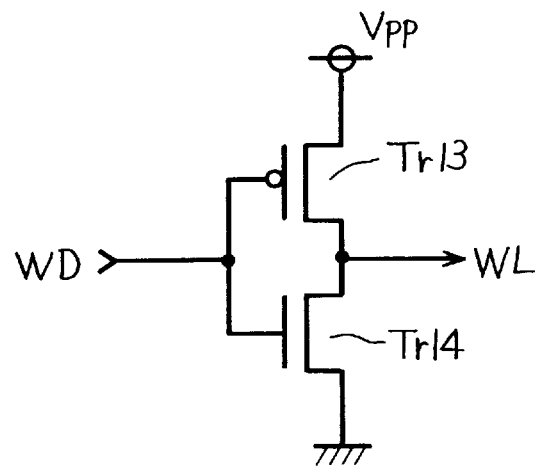
FIG. 16 is a circuit diagram showing in detail a general word line driving circuit.

FIG. 16 is a circuit diagram showing in detail a general word line driving circuit.

Referring to FIG. 16, the word line driving circuit includes a p channel transistor Tr13 and an n channel transistor Tr14. The p channel transistor Tr13 has its drain connected to a boosted power source $V_{PP}$, its source connected to the drain of n channel transistor Tr14, and its gate supplied with a word line activation signal WD. The n channel transistor Tr14 has its source connected to the ground potential, and its gate supplied with the word line activation signal WD.

Operation will now be described. When the word line activation signal WD attains the L level from the H level, a signal WL rises to the H ($V_{PP}$ level). As a result, a word line is activated, and a sense amplifier is operated. Then, after operation of the sense amplifier, the word line activation signal WD attains the H level, and the signal WL falls to the L level.

Figure 17:
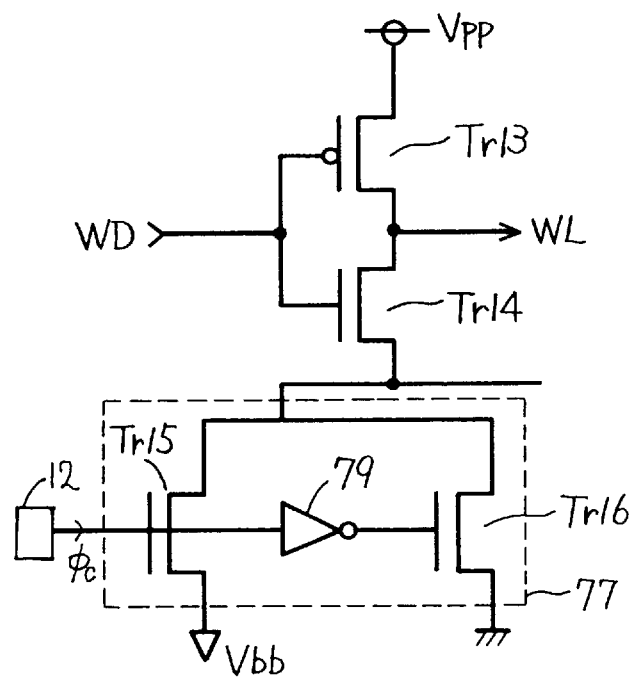
FIG. 17 is a circuit diagram showing in detail a word line driving circuit according to a third embodiment of the present invention.
Figure 18:
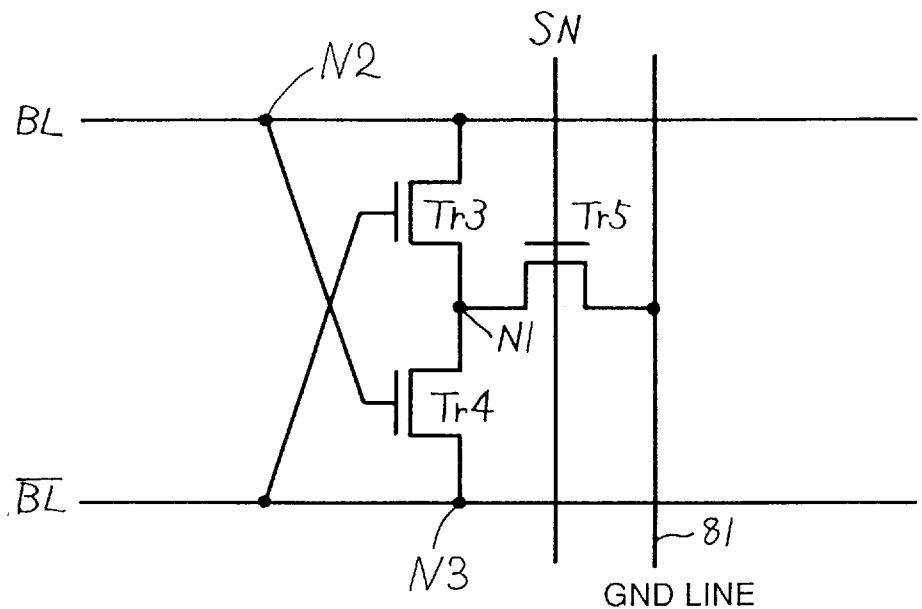
FIG. 18 is a circuit diagram showing in detail a general n channel sense amplifier connected to a GND line of a semiconductor memory device.
Figure 19:
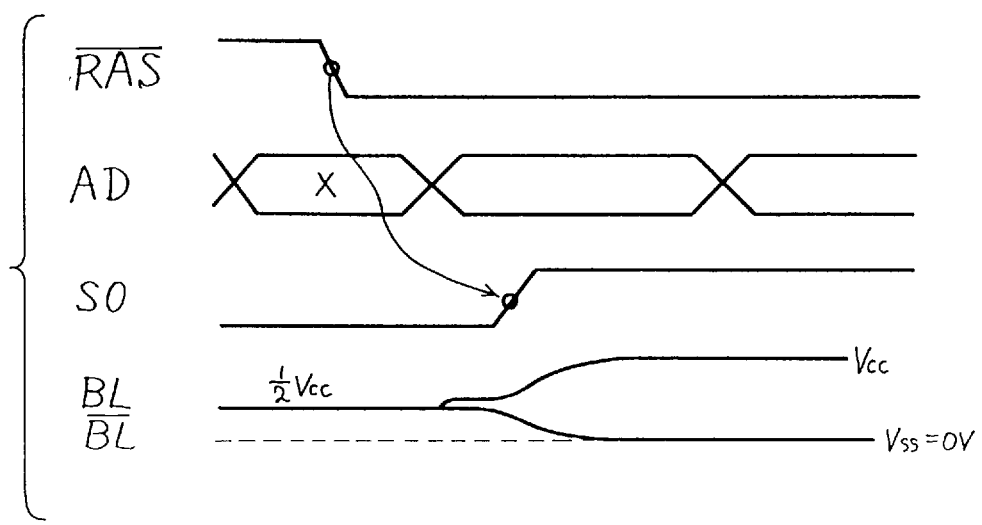
FIG. 19 is a timing chart for explaining operation of the n channel sense amplifier of FIG. 18.

FIG. 17 is a circuit diagram showing in detail a word line driving circuit of the semiconductor memory device according to the third embodiment of the present invention.

Referring to FIG. 17, the word line driving circuit includes a switch circuit 77 and operation signal control circuit 12 in addition to the components of the word line driving circuit of FIG. 16. Switch circuit 77 includes an n channel transistor Tr15, an inverter 79 and an n channel transistor Tr16. The n channel transistor Tr15 has its drain connected to the source of n channel transistor Tr14 of the word line driving circuit, its source connected to the power source $V_{bb}$ which is lower than the ground potential, and its gate supplied with a switch signal φc from operation signal control circuit 12. The n channel transistor Tr16 has its drain connected to the source of n channel transistor Tr14 of the word line driving circuit, its source connected to the ground power source, and its gate supplied with the switch signal φc through inverter 79.

Operation will now be described. Before pulling down the output signal WL to the word line to the L level (before pulling up the word line activation signal to the H level), the source of n channel transistor Tr14 of the word line driving circuit is connected from the ground power source to the power source $V_{bb}$ supplying a potential which is lower than the ground potential in response to the switch signal φc.

Then, when the word line activation signal WD attains the H level to bring the signal WL to the L level, the source of n channel transistor Tr14 tries to be pulled down not to the ground potential but to a potential which is still lower than the ground potential. After a prescribed period, the source of n channel transistor Tr14 of the word line driving circuit is switched to the ground potential in response to the switch signal φc. As a result, according to the third embodiment, the potential differences between the drain and the source and between the source and the gate of n channel transistor Tr14 at the time of falling of the output signal WL are large. Therefore, it is possible to pull down the signal WL at a high speed, that is, a high speed operation of the word line driving circuit can be implemented. As a result, the access time of the semiconductor memory device can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

high potential supplying means for supplying a high potential to a first line;

low potential supplying means for supplying to a second line a low potential which is higher than a ground potential;

an internal circuit connected between said first line and said second line and including a first transistor element;

level lowering means connected to said second line in parallel with said low potential supplying means for lowering a level of a potential of said second line to a potential level which is still lower than said low potential; and operation control means for performing control so that said level lowering means is operated for a prescribed time around the time of start of operation of said internal circuit.

2. The semiconductor memory device according to claim 1, wherein
said internal circuit is potential difference amplifying means for amplifying a small potential difference read out to a bit line from a selected memory cell.

3. The semiconductor memory device according to claim 1, wherein
said level lowering means includes a second transistor element having its control electrode supplied with an operation signal and its one electrode connected to said second line, said second transistor element lowering the level of the potential of said second line to a potential level which is still lower than said low potential in response to said operation signal.

4. The semiconductor memory device according to claim 3, wherein
said low potential supplying means includes a third transistor element having its control electrode and its one electrode connected to said second line.

5. The semiconductor memory device according to claim 4, wherein
said low potential supplying means further includes
reference voltage generating means for generating a reference voltage,
comparing means for comparing the potential of said second line and said reference voltage, and
switching means responsive to an output from said comparing means when the potential of said second line becomes higher than said reference voltage for discharging the potential of said second line.

6. The semiconductor memory device according to claim 4, wherein
said low potential supplying means includes
reference voltage generating means for generating a reference voltage,
comparing means for comparing the potential of said second line and said reference voltage, and
switching means responsive to an output from said comparing means when the potential of said second line becomes lower than said reference voltage for supplying a potential to said second line.

7. The semiconductor memory device according to claim 4, wherein
said low potential supplying means includes
oscillating means for intermittently oscillating an oscillation signal, and
pumping means responsive to said oscillation signal for intermittently supplying a potential to said second line to supplement the potential of said second line up to said low potential.

8. A semiconductor memory device, comprising:
high potential supplying means for supplying a high potential to a first line;
low potential supplying means for supplying a low potential to a second line;
an internal circuit connected between said first line and said second line and including a transistor element;
level lowering means connected to said second line in parallel with said low potential supplying means for lowering a level of a potential of said second line to a potential level which is still lower than said low potential; and
operation control means for performing control so that said level lowering means is operated for a prescribed time around the time of start of operation of said internal circuit.

9. The semiconductor memory device according to claim 8, wherein
said internal circuit is a word line driving circuit for driving a word line.

10. The semiconductor memory device according to claim 9, wherein
said level lowering means includes a switching circuit responsive to an operation signal for or connecting said second line to a line of said potential which is still lower than said low potential.

11. A semiconductor memory device, comprising:
high potential supplying means for supplying a high potential to a first line;
low potential supplying means for supplying to a second line a low potential which is higher than a ground potential;
an internal circuit connected between said first line and said second line and including a first transistor element;
level lowering means connected to said second line in parallel with said low potential supplying means for lowering a level of a potential of said second line to a potential level which is still lower than said low potential; and
operation control means for performing control so that said level lowering means is operated for a prescribed time before operating said internal circuit.

12. The semiconductor memory device according to claim 11, wherein
said internal circuit is potential difference amplifying means for amplifying a small potential difference read out to a bit line from a selected memory cell.

13. The semiconductor memory device according to claim 11, wherein
said level lowering means includes a second transistor element having its control electrode supplied with an operation signal, and its one electrode connected to said second line, said second transistor element lowering the level of the potential of said second line to a potential level which is still lower than said low potential in response to said operation signal.

14. The semiconductor memory device according to claim 13, wherein
said low potential supplying means includes a third transistor element having its control electrode and its one electrode connected to said second line.

15. The semiconductor memory device according to claim 14, wherein
said low potential supplying means further includes
reference voltage generating means for generating a reference voltage,
comparing means for comparing the potential of said second line and said reference voltage, and
switching means responsive to an output from said comparing means when the potential of said second line becomes higher than said reference voltage for discharging the potential of said second line.

16. The semiconductor memory device according to claim 14, wherein
said low potential supplying means includes
reference voltage generating means for generating a reference voltage,
comparing means for comparing the potential of said second line and said reference voltage, and switching means responsive to an output from said comparing means when the potential of said second line becomes lower than said reference voltage for supplying a potential to said second line.

17. The semiconductor memory device according to claim 14, wherein said low potential supplying means includes
oscillating means for intermittently oscillating an oscillation signal, and
pumping means responsive to said oscillation signal for intermittently supplying a potential to said second line to supplement the potential of said second line up to said low potential.

18. A semiconductor memory device, comprising:

high potential supplying means for supplying a high potential to a first line;

a low potential supplying means for supplying a low potential to a second line;

an internal circuit connected between said first line and said second line and including a transistor element;

level lowering means connected to said second line in parallel with said low potential supplying means for lowering a level of a potential of said second line to a potential level which is still lower than said low potential; and operation control means for performing control so that said level lowering means is operated for a prescribed time before operating said internal circuit.

19. The semiconductor memory device according to claim 18, wherein said internal circuit is a word line driving circuit for driving a word line.

20. The semiconductor memory device according to claim 19, wherein said level lowering means includes a switching circuit responsive to an operation signal for connecting said second line to a line of said potential which is still lower than said low potential.

21. The semiconductor memory device according to claim 8, wherein said internal circuit includes potential difference amplifying means for amplifying a small potential difference read out to a bit line from a selected memory cell.

22. The semiconductor memory device according to claim 9, wherein said low potential is a ground potential, and said potential level further lower than said low potential is a negative potential level.

23. The semiconductor memory device according to claim 21, wherein said low potential is a ground potential, and said potential level further lower than said low potential is a negative potential level.

24. The semiconductor memory device according to claim 18, wherein said internal circuit includes potential difference amplifying means for amplifying a small potential difference read out to a bit line from a selected memory cell.

25. The semiconductor memory device according to claim 19, wherein said low potential is a ground potential, and said potential level further lower than said low potential is a negative potential level.

26. The semiconductor memory device according to claim 24, wherein said low potential is a ground potential, and said potential level further lower than said low potential is a negative potential level.

* * * * *

UNITED STATES PATENT AND TRADEMARK OFFICE
CERTIFICATE OF CORRECTION

PATENT NO. : 5,805,519
DATED : September 8, 1998
INVENTOR(S) : Shigeki TOMISHIMA It is certified that error appears in the above-identified patent and that said Letters Patent is hereby corrected as shown below:

Claim 21, line 5, after "bit line" insert --pair--.

Claim 24, line 5, after "bit line" insert --pair--.

Signed and Sealed this

Sixteenth Day of February, 1999

Attest:

*Attesting Officer*

*Acting Commissioner of Patents and Trademarks*